(12) United States Patent
Chen

(10) Patent No.: US 11,233,049 B2
(45) Date of Patent: Jan. 25, 2022

(54) NEUROMORPHIC COMPUTING DEVICE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 467 days.

(21) Appl. No.: 16/441,097

(22) Filed: Jun. 14, 2019

(65) Prior Publication Data
US 2020/0395357 A1    Dec. 17, 2020

(51) Int. Cl.
| H01L 27/088 | (2006.01) |
| H01L 29/417 | (2006.01) |
| G06N 3/04 | (2006.01) |
| G06N 3/063 | (2006.01) |
| H01L 23/522 | (2006.01) |

(52) U.S. Cl.
CPC ......... H01L 27/088 (2013.01); G06N 3/0454 (2013.01); G06N 3/0635 (2013.01); H01L 23/5226 (2013.01); H01L 29/41725 (2013.01)

(58) Field of Classification Search
CPC .............................. G06N 3/0635; G06N 3/063
See application file for complete search history.

(56) References Cited

U.S. PATENT DOCUMENTS

| 5,235,672 | A | 8/1993 | Carson |
| 7,425,740 | B2 | 9/2008 | Liu et al. |
| 8,373,440 | B2 | 2/2013 | Strukov et al. |
| 8,885,422 | B2 | 11/2014 | Ribeiro et al. |
| 9,431,099 | B2 | 8/2016 | Lee et al. |
| 9,514,818 | B1 | 12/2016 | Roizin et al. |
| 9,747,548 | B2 | 8/2017 | Ross et al. |
| 9,805,304 | B2 | 10/2017 | Ross |
| 10,074,051 | B2 | 9/2018 | Thorson et al. |
| 10,242,737 | B1 | 3/2019 | Lin et al. |
| 10,447,274 | B2 | 10/2019 | Lee et al. |
| 2011/0106742 | A1 | 5/2011 | Pino |
| 2018/0165573 | A1 | 6/2018 | Hsu et al. |
| 2018/0174025 | A1 | 6/2018 | Jin |
| 2019/0131523 | A1 | 5/2019 | Park et al. |
| 2019/0156208 | A1 | 5/2019 | Park et al. |

FOREIGN PATENT DOCUMENTS

| CN | 1945829 A | 4/2007 |
| CN | 104701309 A | 6/2015 |
| KR | 20190047884 A | 5/2019 |
| TW | 200715477 A | 4/2007 |
| TW | 201042732 A | 12/2010 |
| TW | 201113986 A | 4/2011 |
| TW | 201706872 A | 2/2017 |

(Continued)

OTHER PUBLICATIONS

TIPO Office Action dated Feb. 4, 2020 in TW application (No. 108120588).

(Continued)

*Primary Examiner* — Amar Movva
(74) *Attorney, Agent, or Firm* — McClure, Qualey & Rodack, LLP

(57) ABSTRACT

A neuromorphic computing device includes synapse weights. The synapse weights have different weight values resulted from different transistor arrangements of the synapse weights.

21 Claims, 20 Drawing Sheets

(56) References Cited

FOREIGN PATENT DOCUMENTS

| TW | 201729124 A | 8/2017 |
|----|-------------|--------|
| TW | 201824092 A | 7/2018 |
| TW | 201830297 A | 8/2018 |
| TW | I641989 B | 11/2018 |
| TW | 201917869 A | 5/2019 |
| TW | 201921282 A | 6/2019 |
| TW | 201921354 A | 6/2019 |
| WO | 2018106969 A1 | 6/2018 |

OTHER PUBLICATIONS

TIPO Office Action dated Feb. 19, 2020 in TW application (No. 108120589).
English translation of TIPO Office Action dated Feb. 19, 2020 in TW application (No. 108120589).
TW Office Action dated Sep. 18, 2020 in Taiwan application (No. 108120587).

NEUROMORPHIC COMPUTING DEVICE

BACKGROUND

Technical Field

The disclosure relates to a neuromorphic computing device.

Description of the Related Art

Recently, neuromorphic computing devices implemented by using memory arrays are proposed. Compared to those devices using processors to perform neuromorphic computations, the neuromorphic computing device has advantages of low power consumption. The neuromorphic computing device may be applied for an artificial intelligence (AI) chip.

The neuromorphic computing device usually includes a plurality of synapses, with each of which corresponds to a weighting value. When an input vector is applied to the neuromorphic computing device, the input vector is multiplied by a weighting vector consists of weighting values corresponding to one or more synapse relating to the input vector, so that a result of sum-of-product is obtained. The sum-of-product calculation is widely used in neuromorphic computing devices.

SUMMARY

The present disclosure relates to a neuromorphic computing device.

According to an embodiment, a neuromorphic computing device is provided. The neuromorphic computing device comprises synapse weights. The synapse weights have different weight values resulted from different transistor arrangements of the synapse weights.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

A neuromorphic computing device according to a first embodiment is illustrate referring to FIG. 1 to FIG. 6. The neuromorphic computing device may be applied in an artificial intelligence (AI) chip which may be applied for an electronic equipment such as a car, a mobile device such as a mobile phone and so on.

Figure 1:
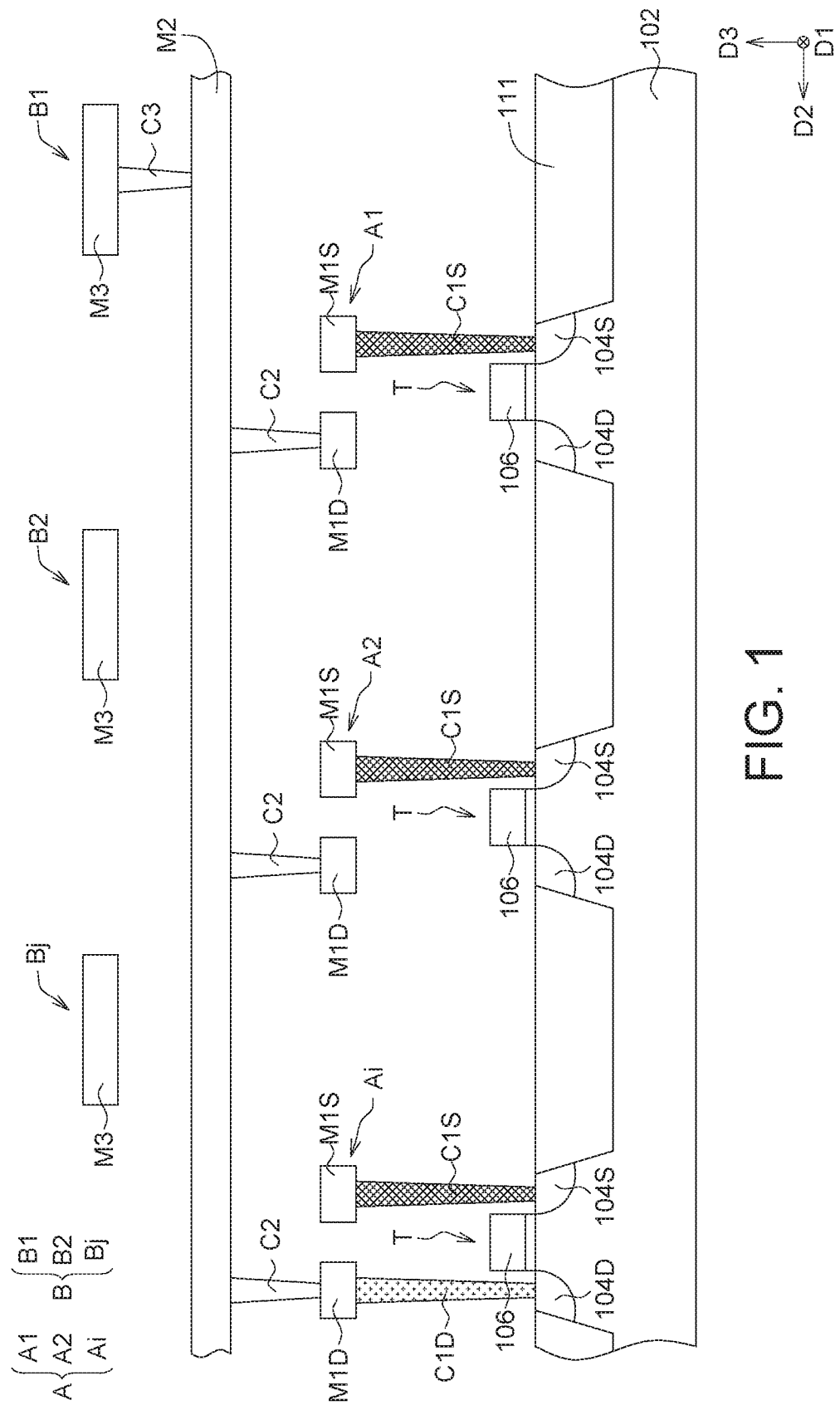
FIG. 1 to FIG. 6 illustrate a method for manufacturing a neuromorphic computing device according to a first embodiment.
Figure 2:
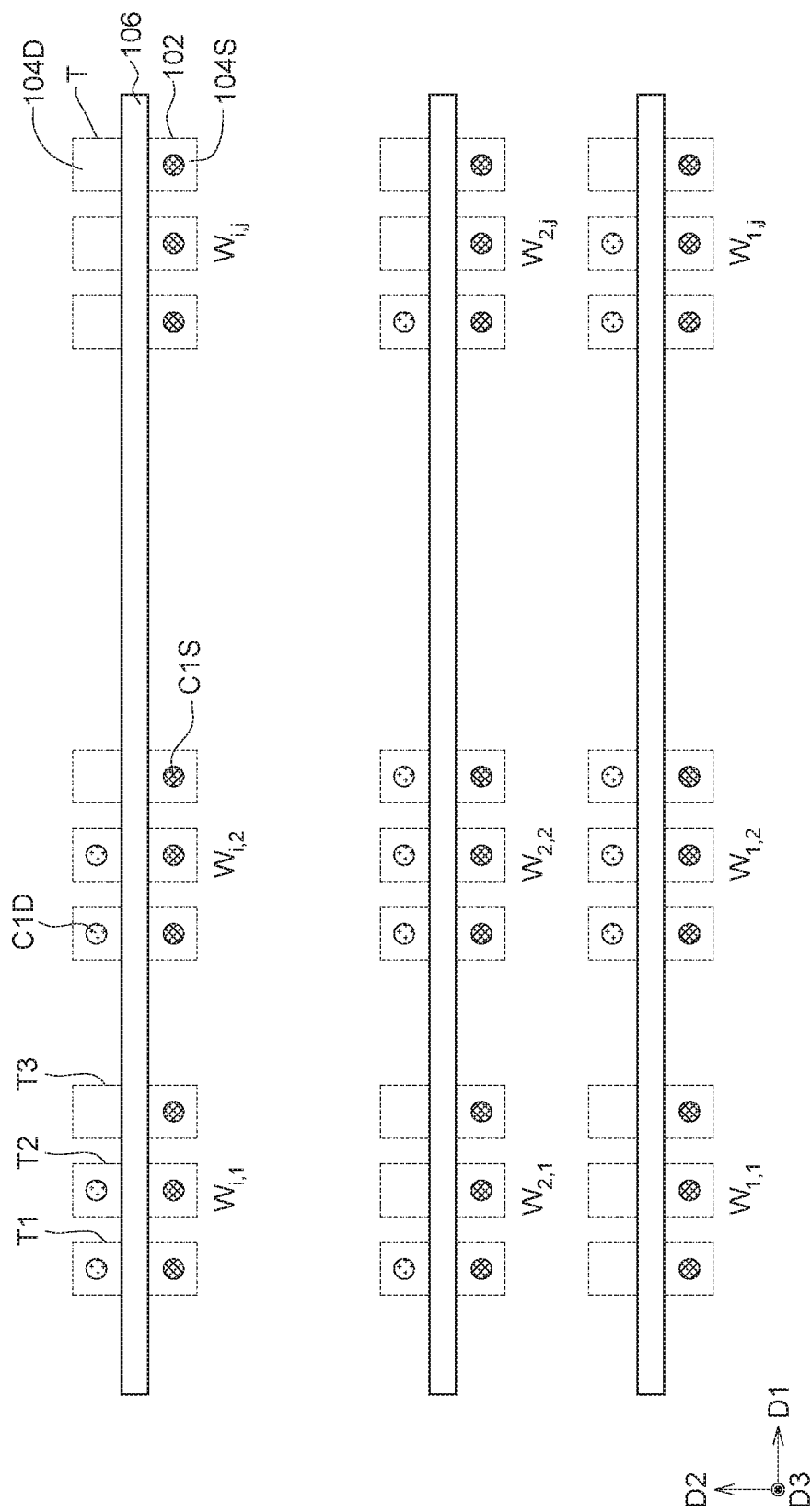

Referring to FIG. 1 showing a cross-section view and FIG. 2 showing a top view of the neuromorphic computing device, transistors T are formed. Each of the transistors T comprises a semiconductor substrate 102, a source/drain 104S, a source/drain 104D, and a gate 106. The semiconductor substrate 102 may comprise a silicon substrate, a silicon containing substrate, or other suitable substrate structures, such as a SOI, and so on. The gate 106 may be formed on the semiconductor substrate 102. The gate 106 may comprise a gate dielectric layer formed on a surface of the semiconductor substrate 102, and a gate electrode formed on the gate dielectric layer.

The source/drain 104S and the source/drain 104D may comprise a doped source/drain formed by implanting dopants into the semiconductor substrate 102 by a doping process. The doping process may use the gate 106 as a mask. The doping process may also use an insulating element 111 (FIG. 1) formed in the semiconductor substrate 102 as a mask. For example, the insulating element used as a mask may comprises a trench isolation structure such as a shallow trench isolation (STI) structure, but is not limited thereto. The insulating element may comprise a field oxide (FOX) structure, or other suitable structures. The source/drain 104S and the source/drain 104D may also comprise a metal silicide layer formed on the doped source/drain. A process for forming the source/drain 104S and the source/drain 104D may also comprise a thermal diffusion step. A channel of the transistors T may be defined between the source/drain 104S and the source/drain 104D, and under the gate 106. One of the source/drain 104S and the source/drain 104D is a source. The other of the source/drain 104S and the source/drain 104D is a drain. In an embodiment, the source/drain 104S is a source, and the source/drain 104D is a drain.

As shown in FIG. 2, the gate 106 may be extended along a first direction D1, so that the transistors T arranged along the first direction D1 may have a common gate. The transistors T arranged along a second direction D2 have the gates 106 separated from each other.

Referring to FIG. 1 and FIG. 2, a first conductive element C1S may be formed on the source/drain 104S. A first conductive element C1D may be formed on the source/drain 104D. The first conductive element C1S may be functioned used as a signal input element of a synapse weight W. The source/drain 104D may be functioned used as a signal output element of the synapse weight W. In an embodiment, the first conductive elements C1S and the first conductive elements C1D are contact elements, and may be extended along a third direction D3. In an embodiment, the first conductive elements C1S and the first conductive elements C1D may be formed at the same time. The first direction D1, the second direction D2 and the third direction D3 are different from each other. For example, the first direction D1, the second direction D2 and the third direction D3 may be perpendicular to each other. In an embodiment, the first direction D1 may be X direction, the second direction D2 may be Y direction, the third direction D3 may be Z direction.

In embodiments, synapse weights W have different transistor arrangements so as to have different weight values. In an embodiment, the weight value of the synapse weight W may be defined according to an amount of active transistor of the synapse weight W. For example, a synapse weight as shown in FIG. 2 comprises a transistors T1 and a transistors T2. First conductive elements C1D are disposed on the source/drains 104D of the transistors T1 and the transistors T2. As such, neural signals (such as voltage signal/current signal) from the first neural circuit A (such as a first neural circuit Ai shown in FIG. 3) are transferred into the transistor T1 and the transistor T2 of the synapse weight $W_{i,1}$ through the first conductive elements C1S and converted into weighted signals by the transistor T1 and the transistor T2, and then the weighted signals (such as current signal/voltage signal converted according to Ohm's law) are transferred from the synapse weight $W_{i,1}$ through the first conductive elements C1D to the second neural circuit B (such as a second neural circuit B1 shown in FIG. 5). In other words, the weight value of the synapse weight $W_{i,1}$ is a total value of weights generated from two transistors T (i.e. the transistors T1 and the transistors T2). The first conductive element C1S may be regarded as a signal input element of the synapse weight W. The first conductive elements C1D may be regarded as a signal output element of the synapse weight W. The synapse weight $W_{i,1}$ also comprises a transistor T3. The source/drain 104D of the transistors T3 is floating. No signal is transferred to second neural circuit B from the source/drain 104D of the transistors T3. Therefore, the transistor T3 is regarded as a dummy transistor. Weight values of the other synapse weights W may be analogous thereto. In embodiments, synapse weights W may have the same amount of transistor, i.e. 3 transistors T. However, the present disclosure is not limited thereto. The synapse weights W may have other amount and/or arrangement of transistors.

In embodiments, the weight values of the synapse weights W may be controlled by a manufacturing process. For example, the weight values of the synapse weights W may be defined according to a dopant arrangement in active regions of the transistor T controlled with a doping parameter such as a dopant impurity, a dopant concentration, a doping power, a doping depth, and so on of a doping process performed to the active regions. For example, the active regions of the transistors T may be defined by the insulating element 111 and may comprise the semiconductor substrate 102, the source/drain 104S, 104D.

In an embodiment, the synapse weights W in the same plane of the neuromorphic computing device may be formed simultaneously with using the same process. As such, for example, the active regions of the transistors T of the synapse weights W may have the same dopant arrangement. Specifically, the semiconductor substrates 102 of the transistors T of the synapse weights W have the same dopant arrangement, and/or the source/drain 104S and the source/drain 104D of the transistors T of the synapse weights W have the same dopant arrangement. As such, the transistors T of the synapse weights W have the same weight value.

In another embodiment, the synapse weights W in the same plane of the neuromorphic computing device may be formed individually with using different manufacturing processes. As such, for example, the active regions of the transistors T of the synapse weights W may have different dopant arrangements. Specifically, the semiconductor substrates 102 of the transistors T of the synapse weights W have different dopant arrangements, and/or the source/drain 104S and the source/drain 104D of the transistors T of the synapse weights W have different dopant arrangements. As such, the transistors T of the synapse weights W have different weight values.

Figure 2A:
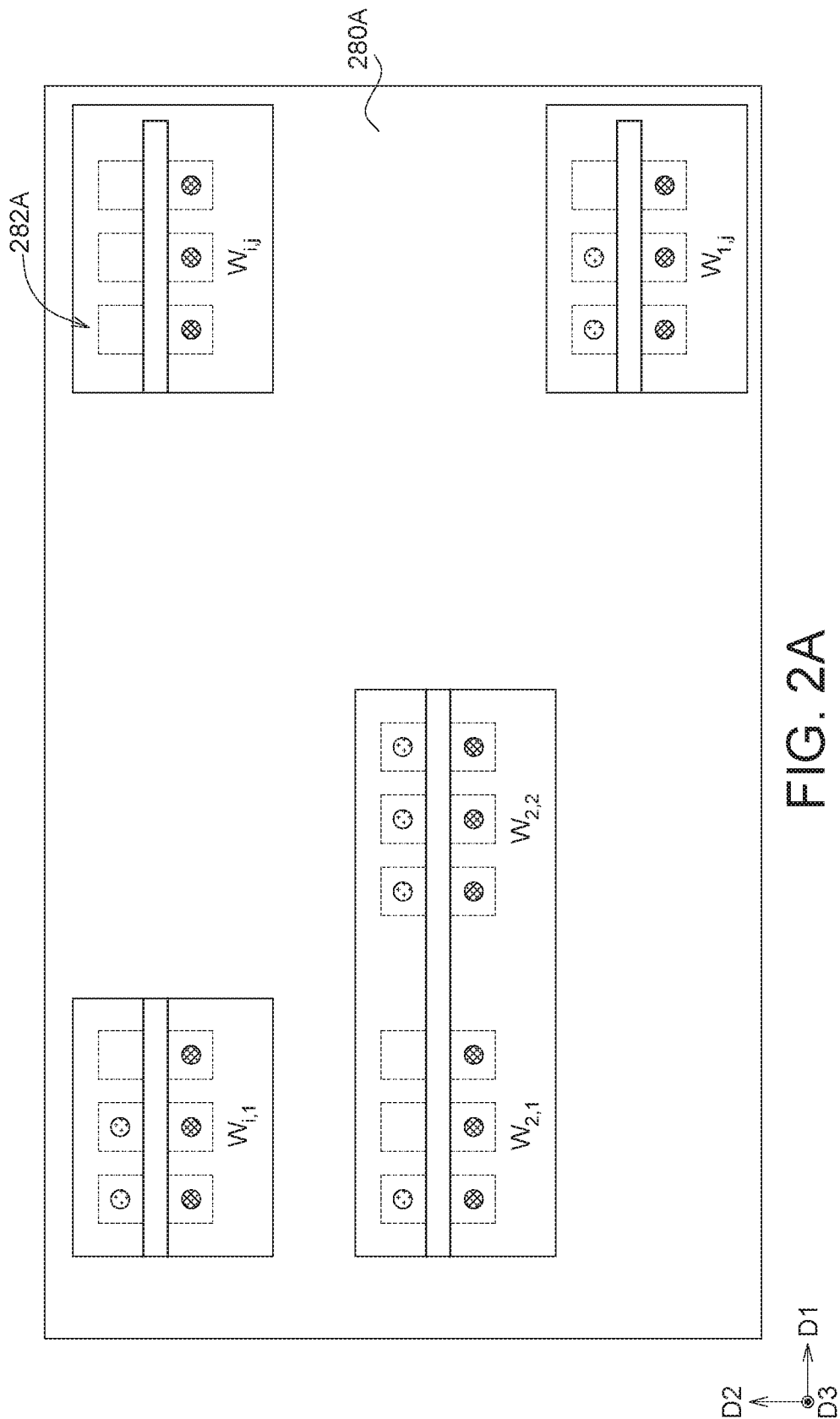
Figure 2B:
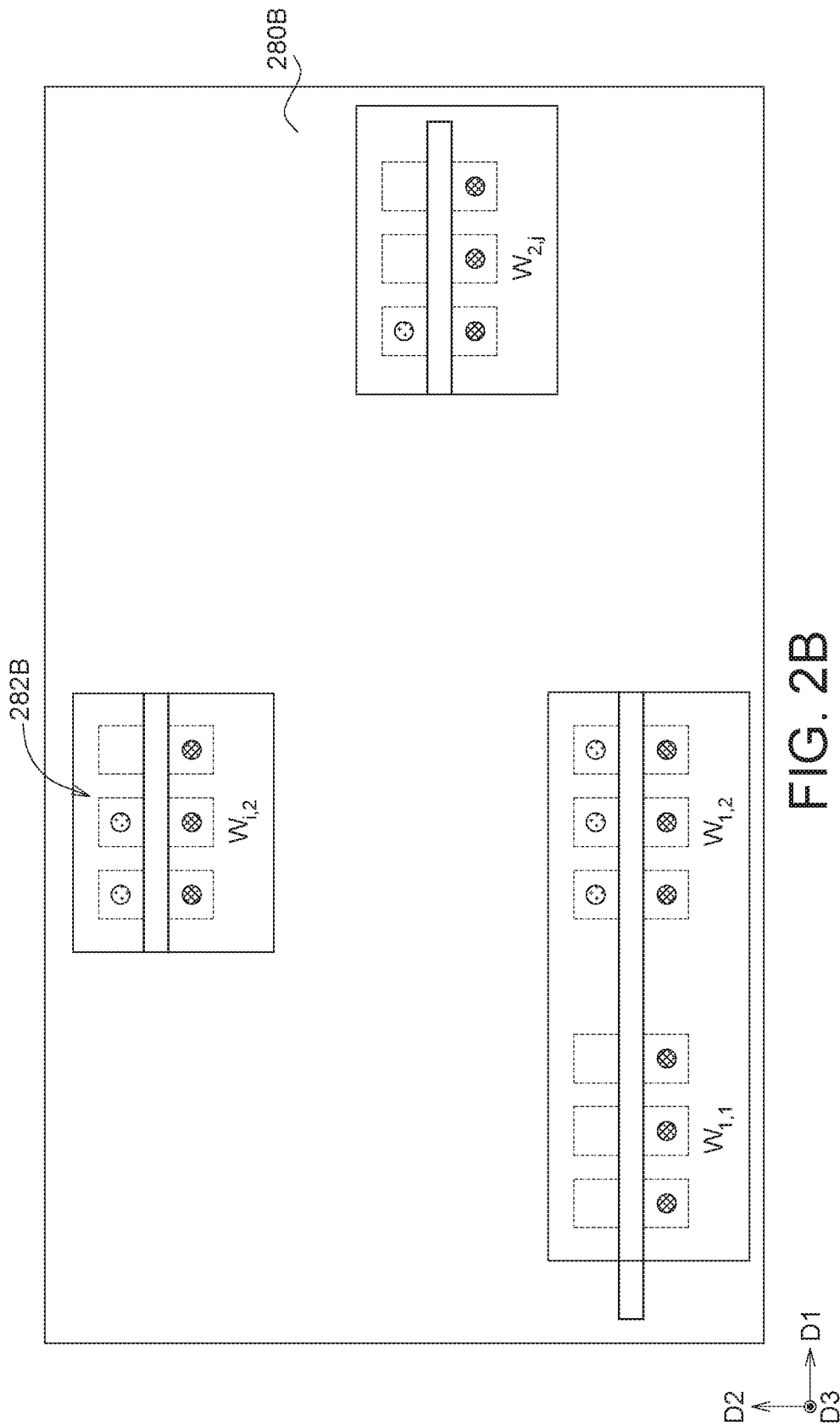

For example, in a manufacturing process for the neuromorphic computing device shown in FIG. 2, a doping step using a mask 280A as shown in FIG. 2A as a doping mask may be performed. The mask 280A has openings 282A exposing regions of the synapse weights $W_{1,j}$, $W_{2,1}$, $W_{2,2}$, $W_{i,1}$ and $W_{i,j}$. Therefore, the transistors T of the synapse weights $W_{1,j}$, $W_{2,1}$, $W_{2,2}$, $W_{i,1}$ and $W_{i,j}$ may be formed by the same doping step to have the same dopant condition and the same weight values. In a manufacturing process for the neuromorphic computing device shown in FIG. 2, a doping step using a mask 280B as shown in FIG. 2B as a doping mask may be performed. The mask 280B has openings 282B exposing regions of the synapse weights $W_{1,1}$, $W_{1,2}$, $W_{2,j}$ and $W_{i,2}$. Therefore, the transistors T of the synapse weights $W_{1,1}$, $W_{1,2}$, $W_{2,j}$, and $W_{i,2}$ may be formed by the same doping step to have the same dopant condition and the same weight values. If the doping steps respectively using the mask 280A and the mask 280B are performed with doping parameters different from each other, the weight values of the transistors T of the synapse weights $W_{1,j}$, $W_{2,1}$, $W_{2,2}$, $W_{i,1}$, and $W_{i,j}$ may be different from the weight values of the transistors T of the synapse weights synapse weights $W_{1,1}$, $W_{1,2}$, $W_{2,j}$ and $W_{i,2}$. For example, the different weight values of the transistors T may be resulted from different dopant concentrations of the active regions. In an embodiment, the mask 280A and the mask 280B may be photoresist layers having different opening arrangements formed by transferring patterns of different photomasks.

In embodiments, the synapse weight having different weight values may be defined by different transistor arrangements. The different transistor arrangements may be formed by transferring a pattern of a photomask. Therefore, an additional writing step in an operating process is not needed for the synapse weight having different weight values. A manufacturing cost could be reduced. In addition, it benefits uniformity of the synapse weights of different chips. It is proper to manufacture the neuromorphic computing device in a mass production and well-trained. For example, in a neural network technique, since different devices having the neuromorphic computing devices manufactured according to the disclosed method have excellent uniformity with each other, the different device could infer identical results from receiving the same image to be identified in an inference calculating in the neural network.

In an embodiment, the active regions of the transistors T of the synapse weights as shown in FIG. 2 have the same dopant condition, and the weight values of the synapse weights relate to the amount of the active transistors, complying with $W_{1,1}: W_{1,2}: W_{1,j}: W_{2,1}: W_{2,2}: W_{2,j}: W_{i,1}: W_{i,2}: W_{i,j}=0:3:2:1:3:1:2:2:0$. However, the present disclosure is not limited thereto. In other embodiments, the weight values of the synapse weights may have other relations resulted from the amount of the active transistor, and/or a structure arrangement of the transistor T such as a dopant condition of the active region.

FIG. 2 shows the synapse weight $W_{1,1}$, the synapse weight $W_{1,2}$, the synapse weight $W_{1,j}$, the synapse weight $W_{2,1}$, the synapse weight $W_{2,2}$, the synapse weight $W_{2,j}$, the synapse weight $W_{i,1}$, the synapse weight $W_{i,2}$, the synapse weight $W_{i,j}$, which may be collectively described as synapse weights W in the disclosure. j indicated for the synapse weight $W_{1,j}$ may be an integer of 3 or more, indicating that there may be one or more synapse weights, such as synapse weights $W_{1,3}$, $W_{1,4}$, $W_{1,5}$, and so on, electrically connected to the same first neural circuit together with the synapse weight $W_{1,1}$ and the synapse weight $W_{1,2}$. The other elements marked with "i" and "J" may be analogous thereto.

Figure 3:
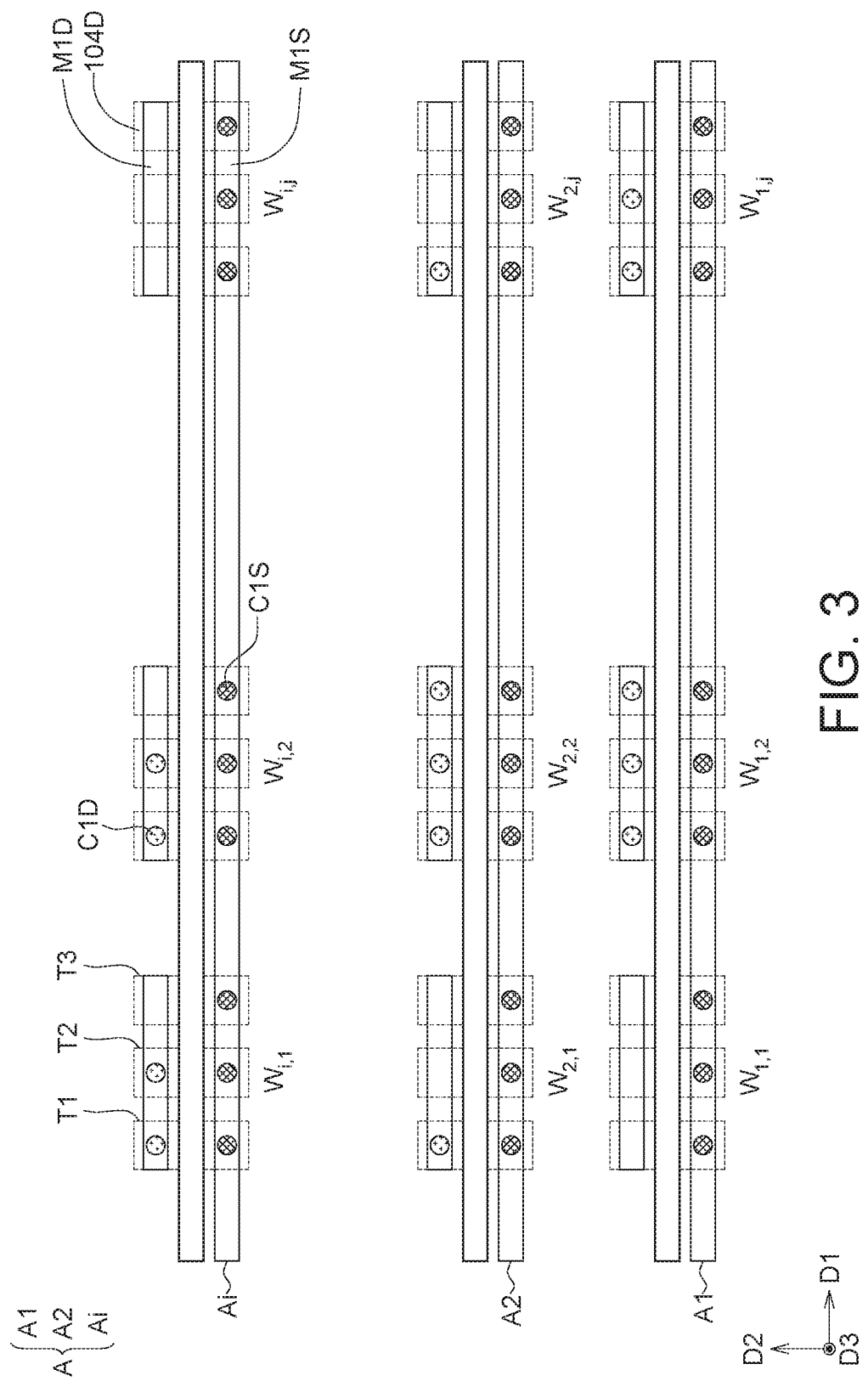
Figure 5:
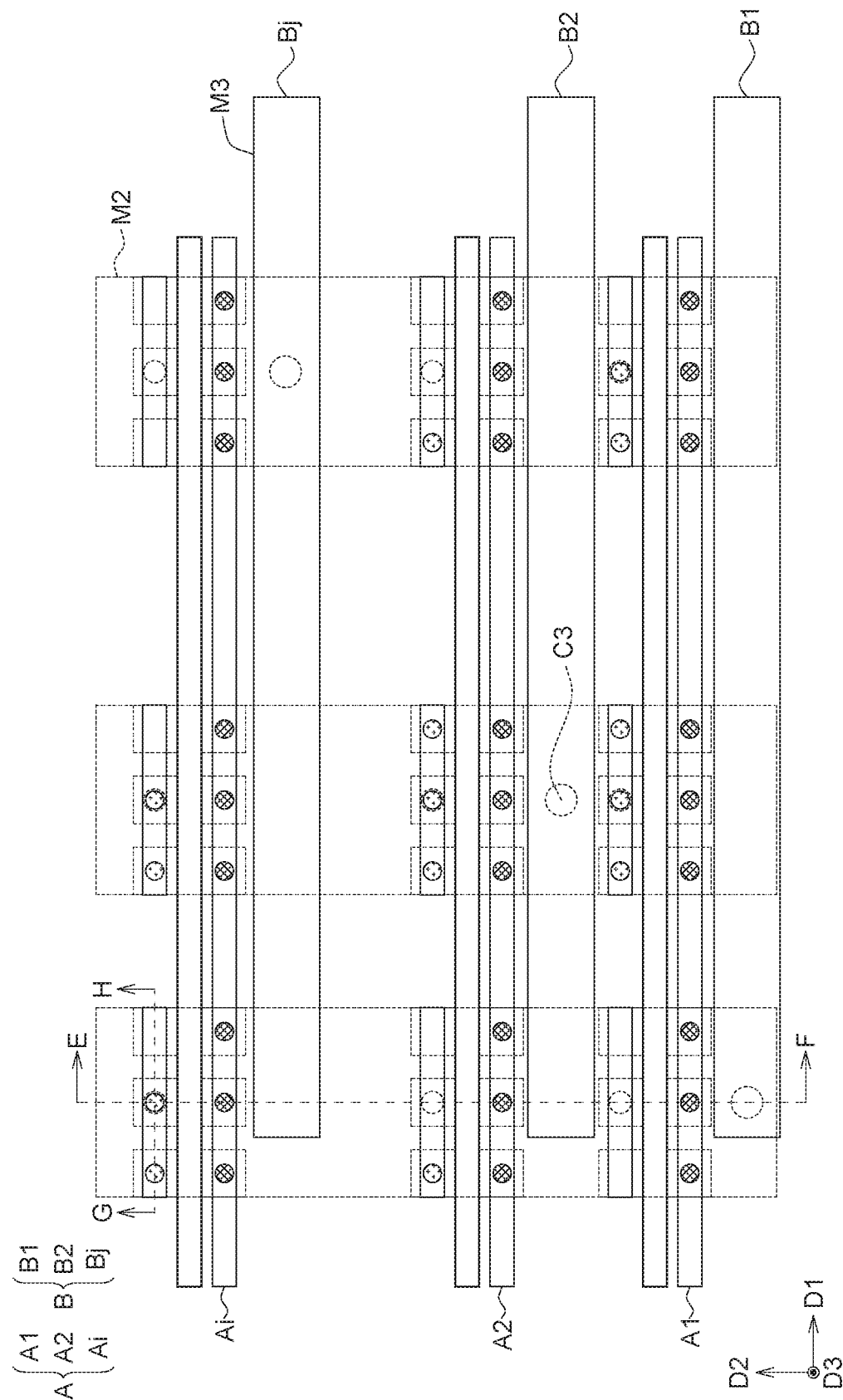

Referring to FIG. 1 and FIG. 3, first conductive layers M1S and first conductive layers M1D may be formed. The first conductive layer M1S may be extended along the first direction D1, and disposed on the first conductive elements C1S of the synapse weights W arranged along the first direction D1, and on an inter-layer dielectric (not shown). In an embodiment, each of first neural circuits A (such as a first neural circuit A1, a first neural circuit A2 and a first neural circuit Ai) comprises the first conductive layer M1S. The first conductive element C1S may be electrically connected between the first conductive layer M1S of the first neural circuit A and the source/drain 104S of the transistors T. The first conductive layer M1D may be extended along the first direction D1, and disposed on the first conductive element C1D and the inter-layer dielectric (not shown). In an embodiment, the first conductive element C1D and the first conductive layer M1D may be electrically connected between the source/drain 104D of the active transistor and the second neural circuit B (FIG. 5). The source/drain 104D of the dummy transistor may be isolated from the first conductive layer M1D by the inter-layer dielectric (not shown) so as to be electrically isolated from the second neural circuit B. In an embodiment, the first conductive layers M1S and the first conductive layers M1D may be formed at the same time. In an embodiment, the first conductive layers M1S and the first conductive layers M1D may be a first metal layer (Metal-1).

Figure 4:
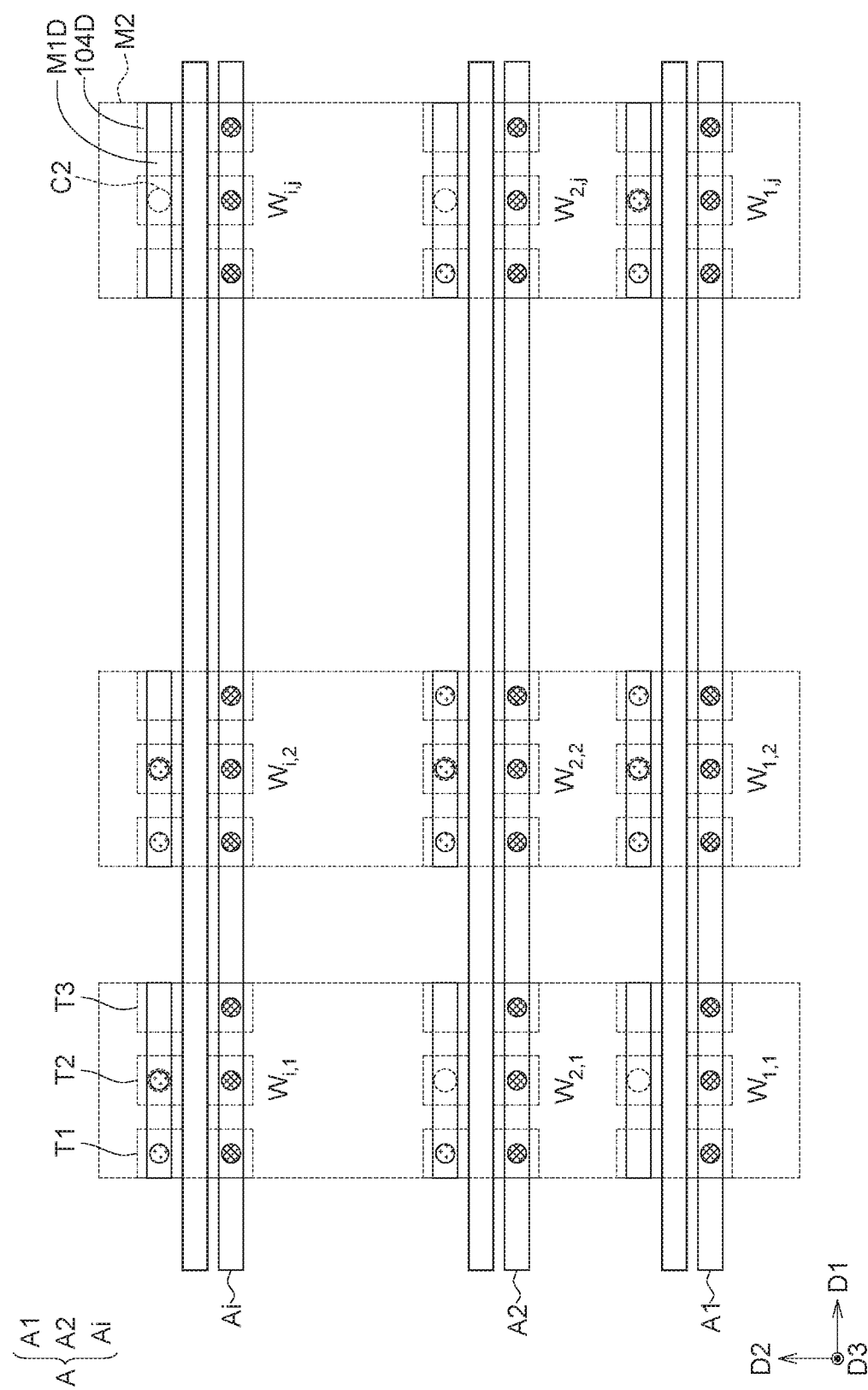

Referring to FIG. 1 and FIG. 4, second conductive elements C2 may be formed on the first conductive layers M1D. Second conductive layers M2 may be formed on the second conductive elements C2. The second conductive element C2 is electrically connected between the first conductive layer M1D and the second conductive layer M2. The second conductive layer M2 may be extended along the second direction D2, and electrically connected to the second conductive elements C2 arranged along the second direction D2. As such, the synapse weights W arranged along the second direction D2 may be electrically connected to the common second conductive layer M2. The second conductive layer M2 may be used as a second neural circuit B to gather the weighted signals from the synapse weights W arranged along the second direction D2. In other words, the second neural circuit B may comprise the second conductive layer M2. In an embodiment, the second conductive elements C2 may be a via formed in an inter-layer dielectric. In an embodiment, the second conductive layers M2 may be a second metal layer (Metal-2).

Referring to FIG. 1 and FIG. 5, third conductive elements C3 may be formed on the second conductive layers M2. Third conductive layers M3 may be formed on the third conductive elements C3. The third conductive element C3 is electrically connected between the second conductive layer M2 and the third conductive layer M3. In an embodiment, the third conductive elements C3 may be a via formed in an inter-layer dielectric. In an embodiment, the third conductive layers M3 may be a third metal layer (Metal-3). In an embodiment, each of the second neural circuit B (such as a second neural circuit B1, a second neural circuit B2 and a second neural circuit Bj) may comprise the second conductive layer M2, the third conductive element C3 and the third conductive layer M3 The second neural circuit B may comprise other devices such as a sensor device and/or a calculating device, etc. For example, the second neural circuit B may comprise a current sensor for sensing a current signal entering the second neural circuit B. For example, the third conductive layer M3 may be electrically connected to the other devices of the second neural circuit B.

Figure 6:
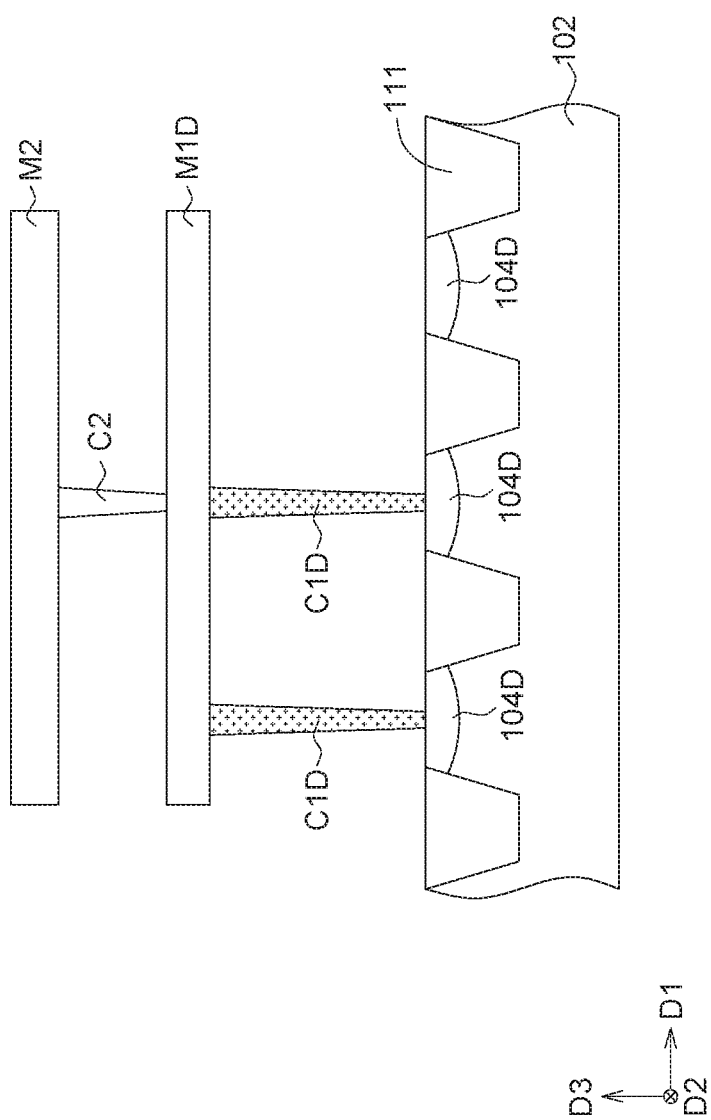

FIG. 1 is a cross-section view of the neuromorphic computing device along a EF line of FIG. 5. FIG. 6 is a cross-section view of the neuromorphic computing device along a GH line of FIG. 5. The cross-section views of FIG. 1 and FIG. 6 do not show the inter-layer dielectric of the neuromorphic computing device.

A neuromorphic computing device according to a second embodiment is illustrated referring to FIG. 7 to FIG. 12.

Figure 7:
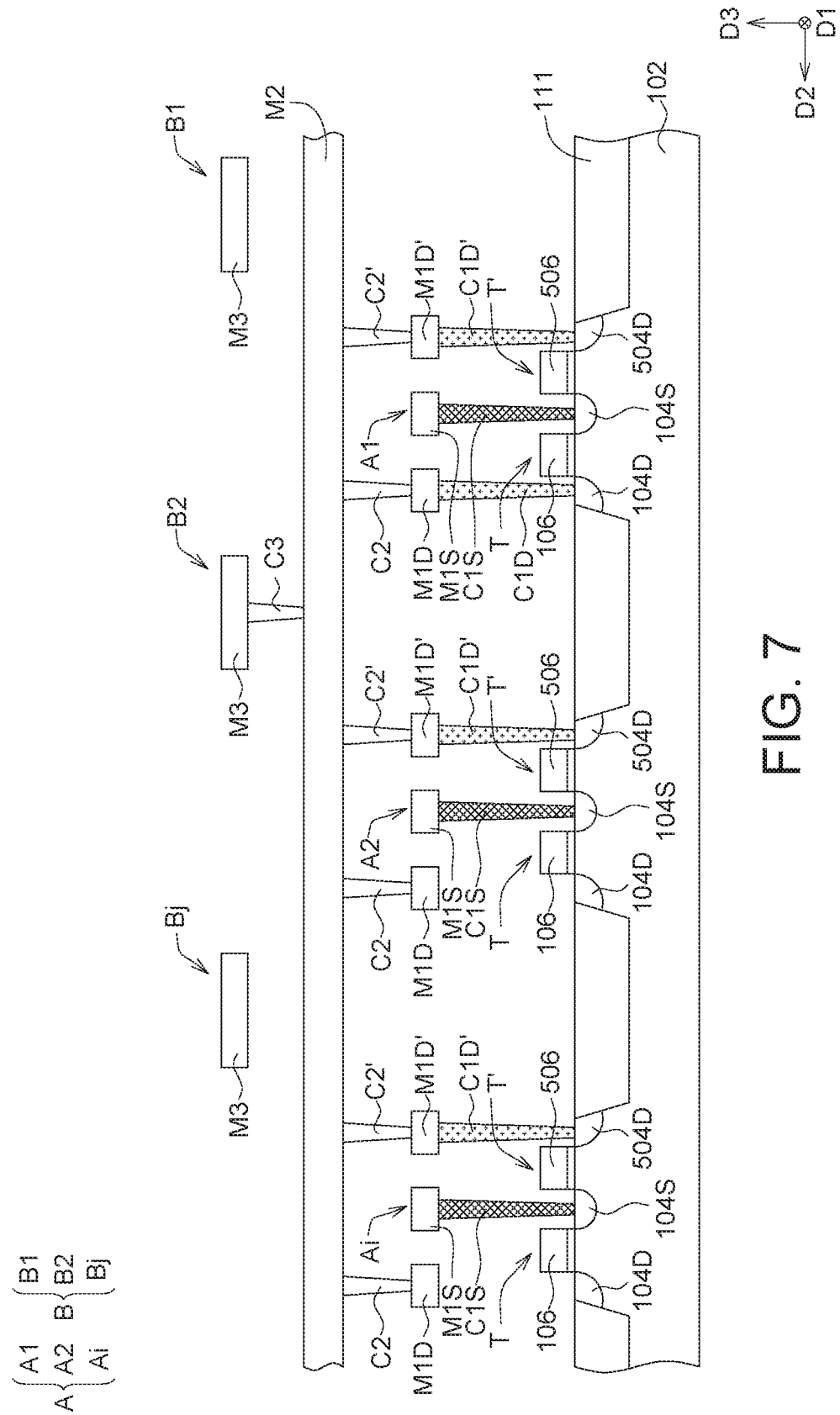
FIG. 7 to FIG. 12 illustrate a method for manufacturing a neuromorphic computing device according to a second embodiment.
Figure 8:
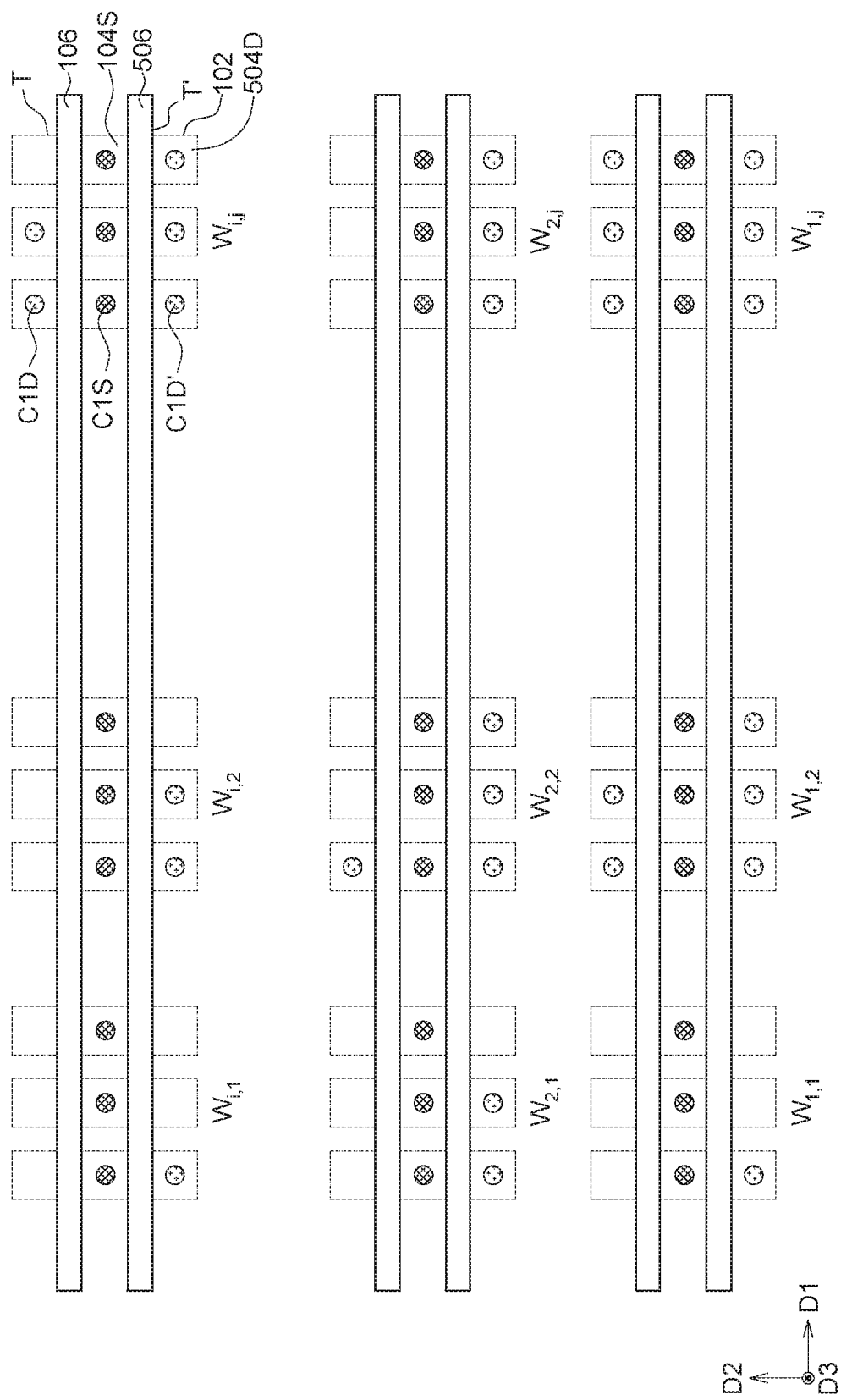

FIG. 7 and FIG. 8 are referred, which are respectively different from FIG. 1 and FIG. 2 with the following illustrations. Transistors T' are formed. Each of the transistors T' comprises the semiconductor substrate 102, the source/drain 104S, a source/drain 504D, and a gate 506. The gate 506 may be formed on the semiconductor substrate 102. A channel of the transistors T' may be defined between the source/drain 104S and the source/drain 504D, and under the gate 506. One of the source/drain 104S and the source/drain 504D is a source, and the other of the source/drain 104S and the source/drain 504D is a drain. In an embodiment, the source/drain 104S is the source, and the source/drain 504D is the drain. The gate 506 may be extended along the first direction D1, so that the transistors T' arranged along the first direction D1 may have a common gate. The transistors T and the transistors T' arranged along the second direction D2 have the gates 106 and the gates 506 separated from each other. The source/drain 104S is a common source of the transistor T and the transistor T'. The transistor T and the transistor T' may share the same first conductive element C1S. In an embodiment, the transistors T and the transistors T' may be formed at the same time. First conductive elements C1D' may be formed on the source/drains 504D. In an embodiment, the first conductive elements C1S, the first conductive elements C1D, and the first conductive elements C1D' may be formed at the same time. In embodiments, 54 transistors as shown in FIG. 8 define out 9 synapse weights W. Each of the synapse weights W has 6 transistors, i.e. 3 transistors T and 3 transistors T'. In an embodiment, weight values of the synapse weights as shown in FIG. 8 relate to the amount of active transistor, and may comply with $W_{1,1}$: $W_{1,2}$: $W_{1,j}$: $W_{2,1}$: $W_{2,2}$: $W_{2,j}$: $W_{i,1}$: $W_{i,2}$: $W_{i,j}$=1:5:6:2:4:3: 1:2:5. However, the present disclosure is not limited thereto. In other embodiments, the weight values of the synapse weights may have other relations resulted from the amount of the active transistor, and/or a structure arrangement of the transistor T such as a dopant condition of the active region.

Figure 9:
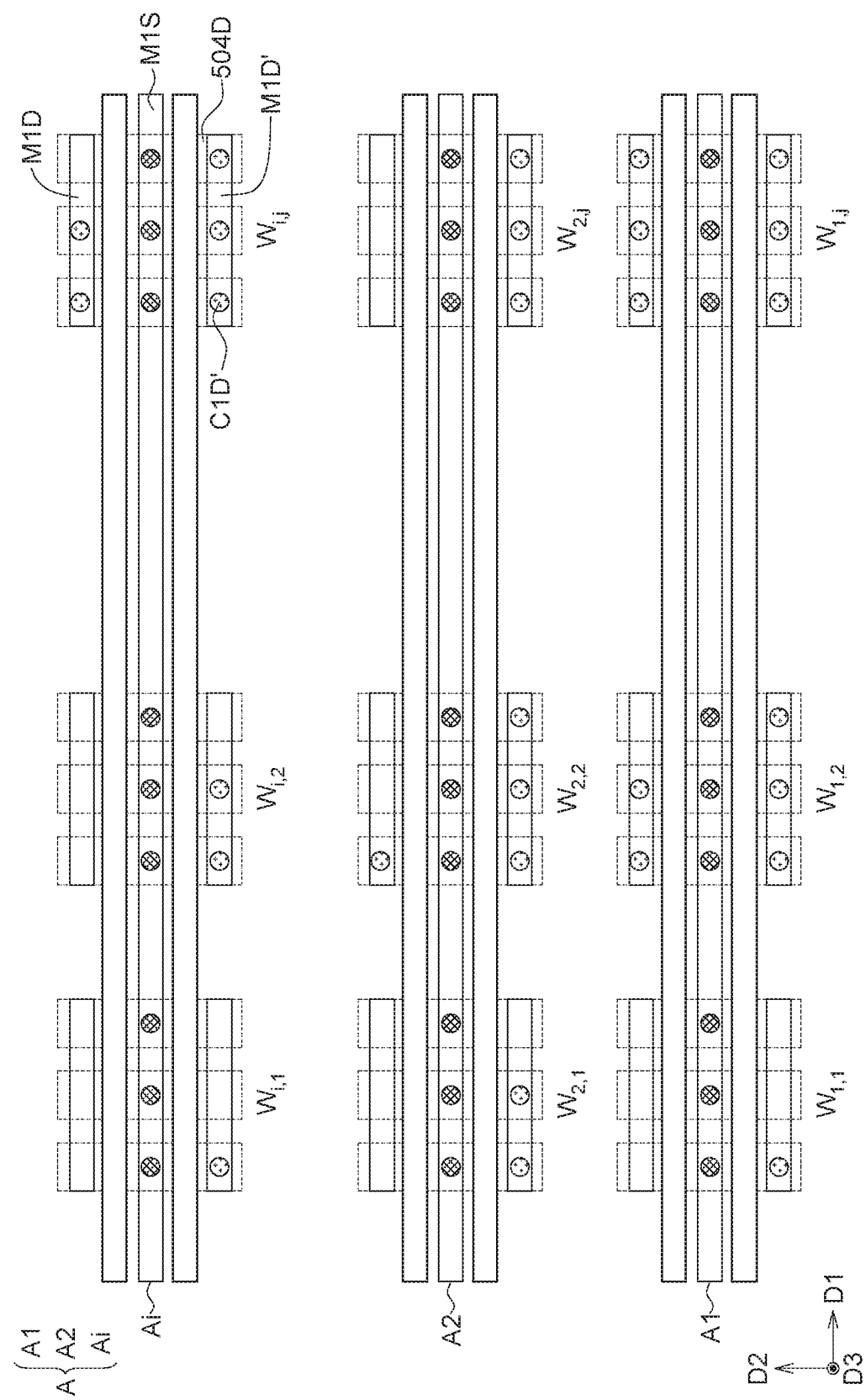

FIG. 7 and FIG. 9 are referred, which are respectively different from FIG. 1 and FIG. 3 with the following illustrations. First conductive layers M1D' may be formed. The first conductive layer M1D' may be extended along the first direction D1, and disposed on the first conductive elements C1D' and the inter-layer dielectric (not shown). The first conductive element C1D' is electrically connected between the first conductive layer M1D' and the source/drain 504D of the active transistor. The source/drain 504D of the dummy transistor may be isolated from the first conductive layer M1D' by the inter-layer dielectric (not shown). In an embodiment, the first conductive layers M1S, the first conductive layers M1D and the first conductive layers M1D' may be formed at the same time. In an embodiment, the first conductive layers M1S, the first conductive layers M1D and the first conductive layers M1D' may be a first metal layer.

Figure 10:
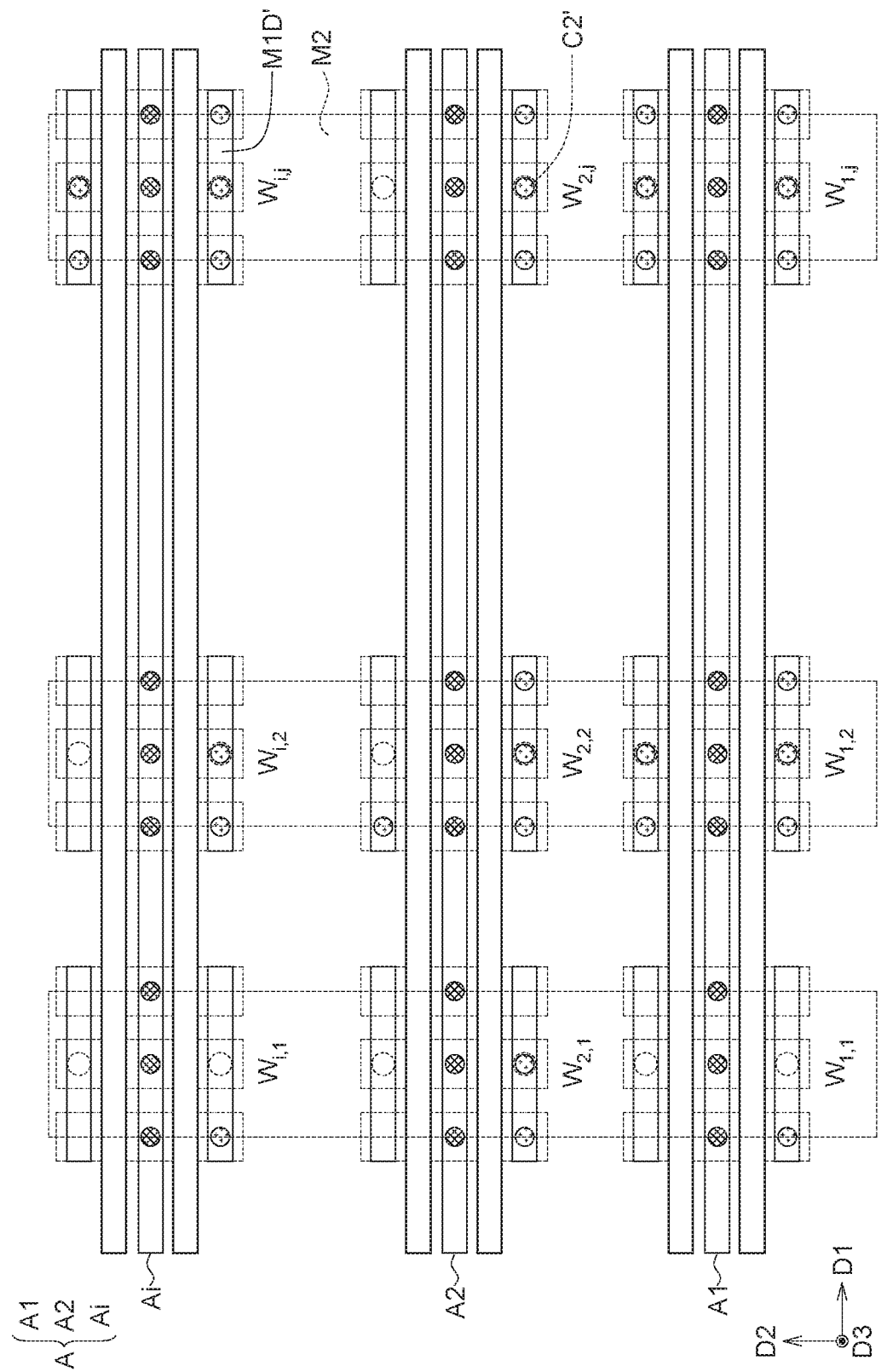

FIG. 7 and FIG. 10 are referred, which are respectively different from FIG. 1 and FIG. 3 with the following illustrations. Second conductive elements C2' may be formed on the first conductive layers M1D'. The second conductive layers M2 are also on the second conductive elements C2'.

Figure 11:
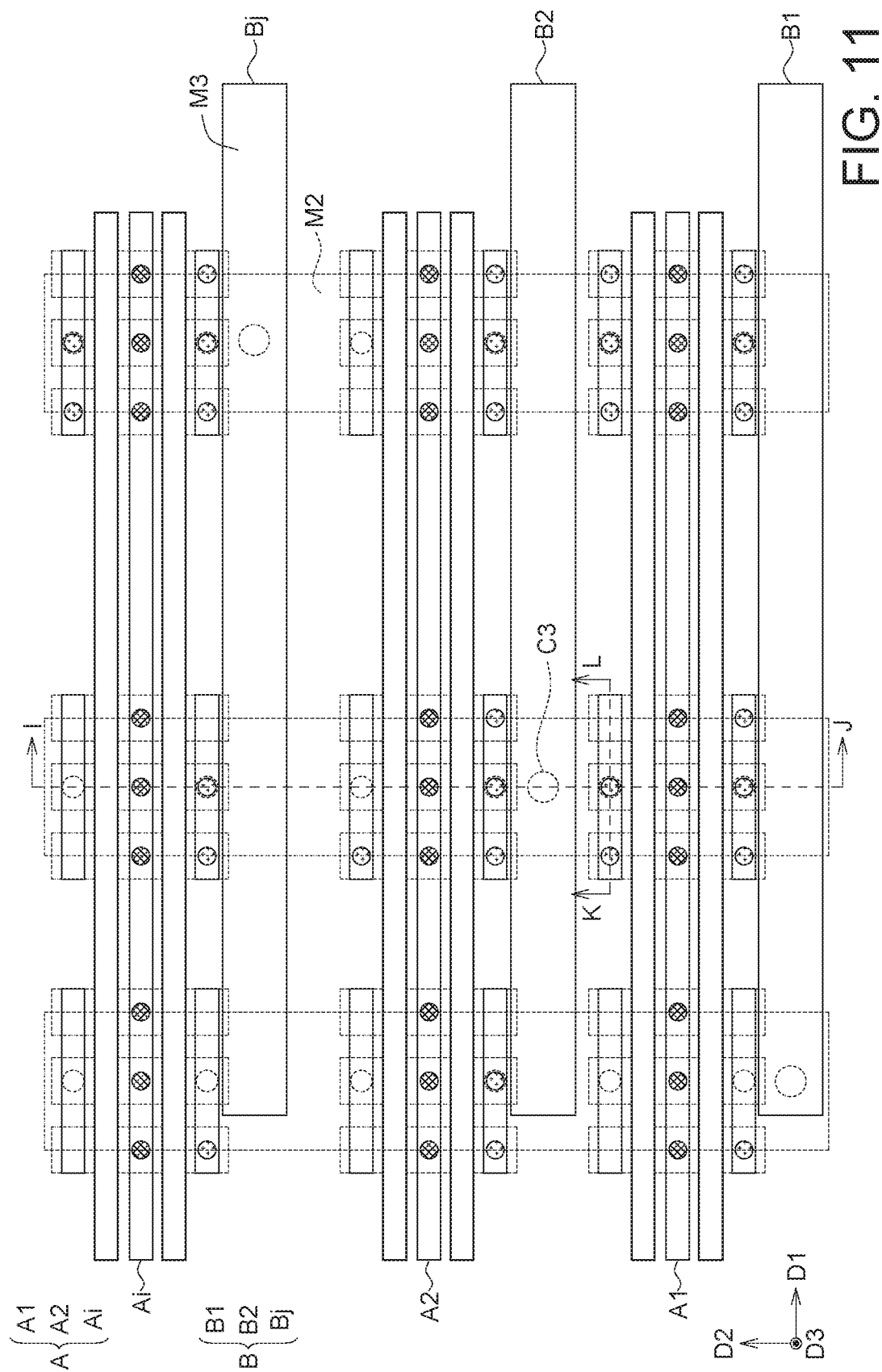

Referring to FIG. 7 and FIG. 11, the third conductive elements C3 may be formed on the second conductive layers M2. The third conductive layer M3 may be formed on the third conductive elements C3. The third conductive element C3 is electrically connected between the second conductive layer M2 and the third conductive layer M3. In this embodiment, the second neural circuit B may comprise the second conductive layer M2, the third conductive element C3 and the third conductive layer M3.

Figure 12:
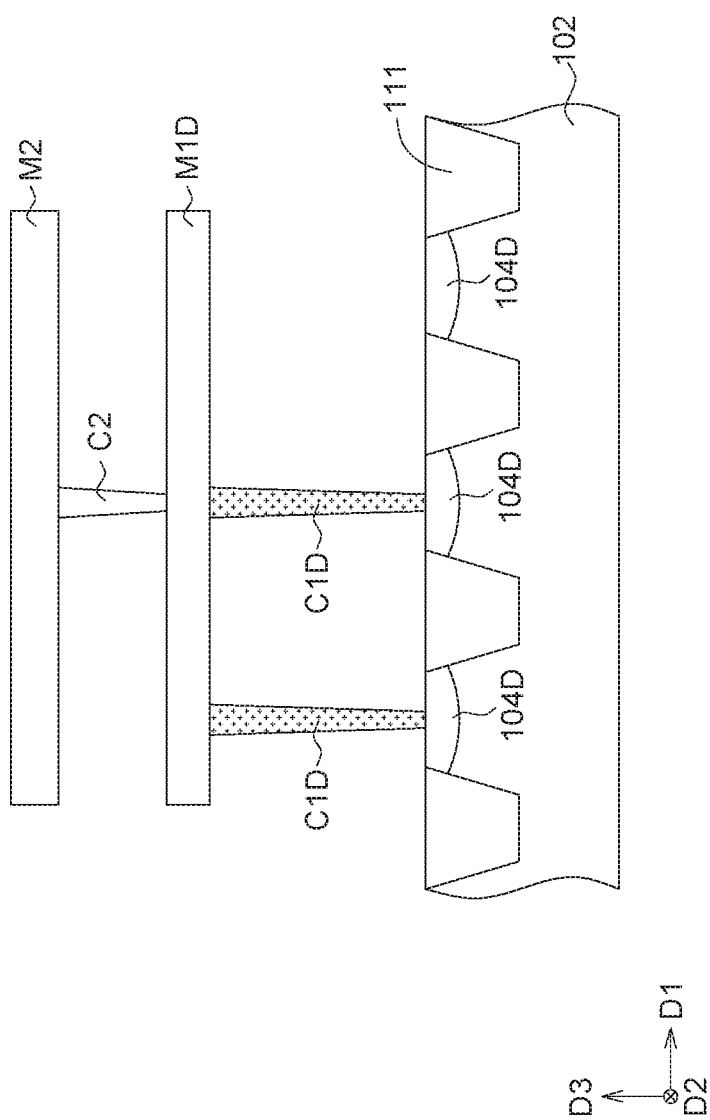

A cross-section view of the neuromorphic computing device along a IJ line in FIG. 11 is shown in FIG. 7. A cross-section view of the neuromorphic computing device along a KL line in FIG. 11 is shown in FIG. 12. The cross-section views of FIG. 7 and FIG. 12 do not show the inter-layer dielectric of the neuromorphic computing device.

A neuromorphic computing device according to a third embodiment is illustrated referring to FIG. 13 to FIG. 18.

Figure 13:
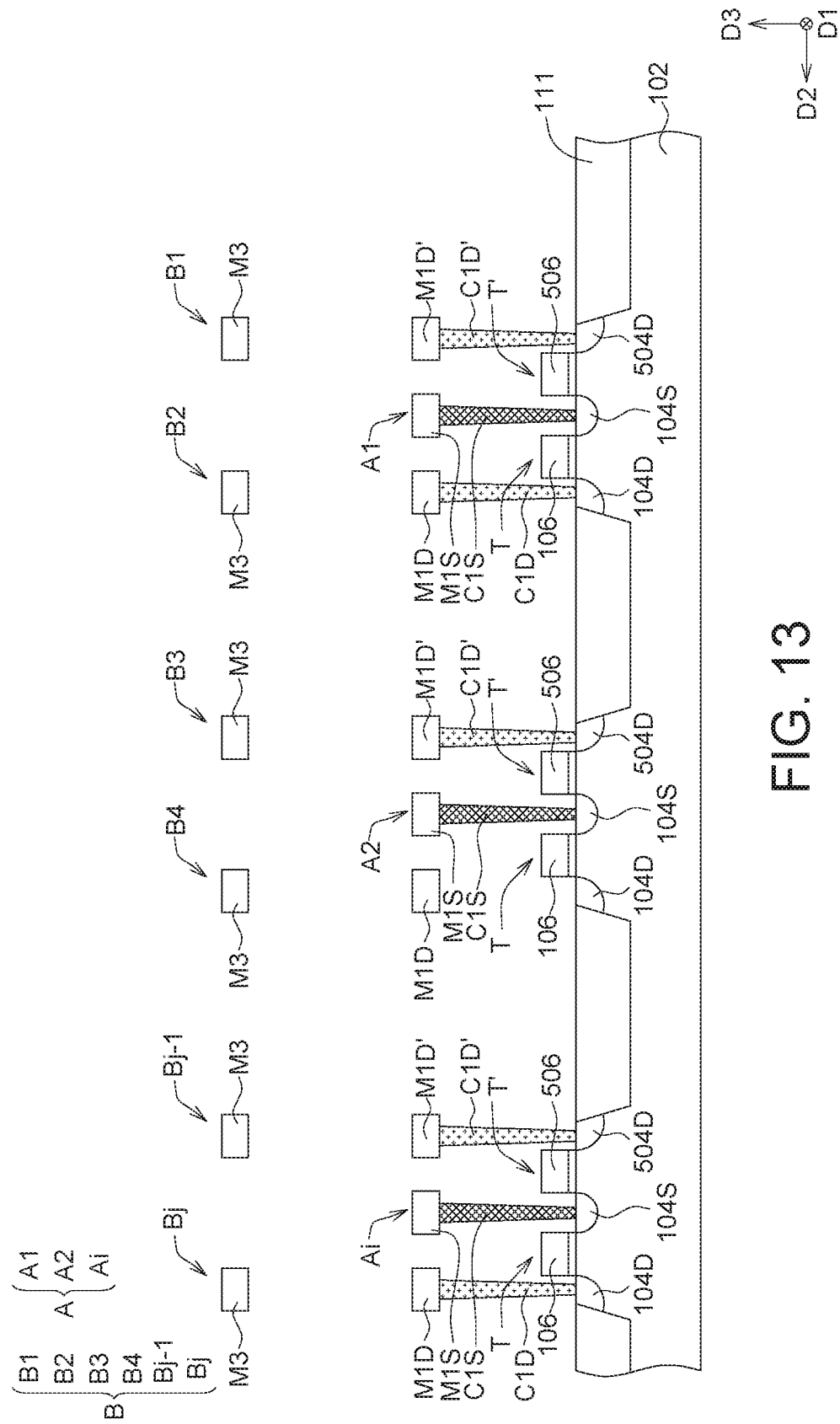
FIG. 13 to FIG. 18 illustrate a method for manufacturing a neuromorphic computing device according to a third embodiment.
Figure 14:
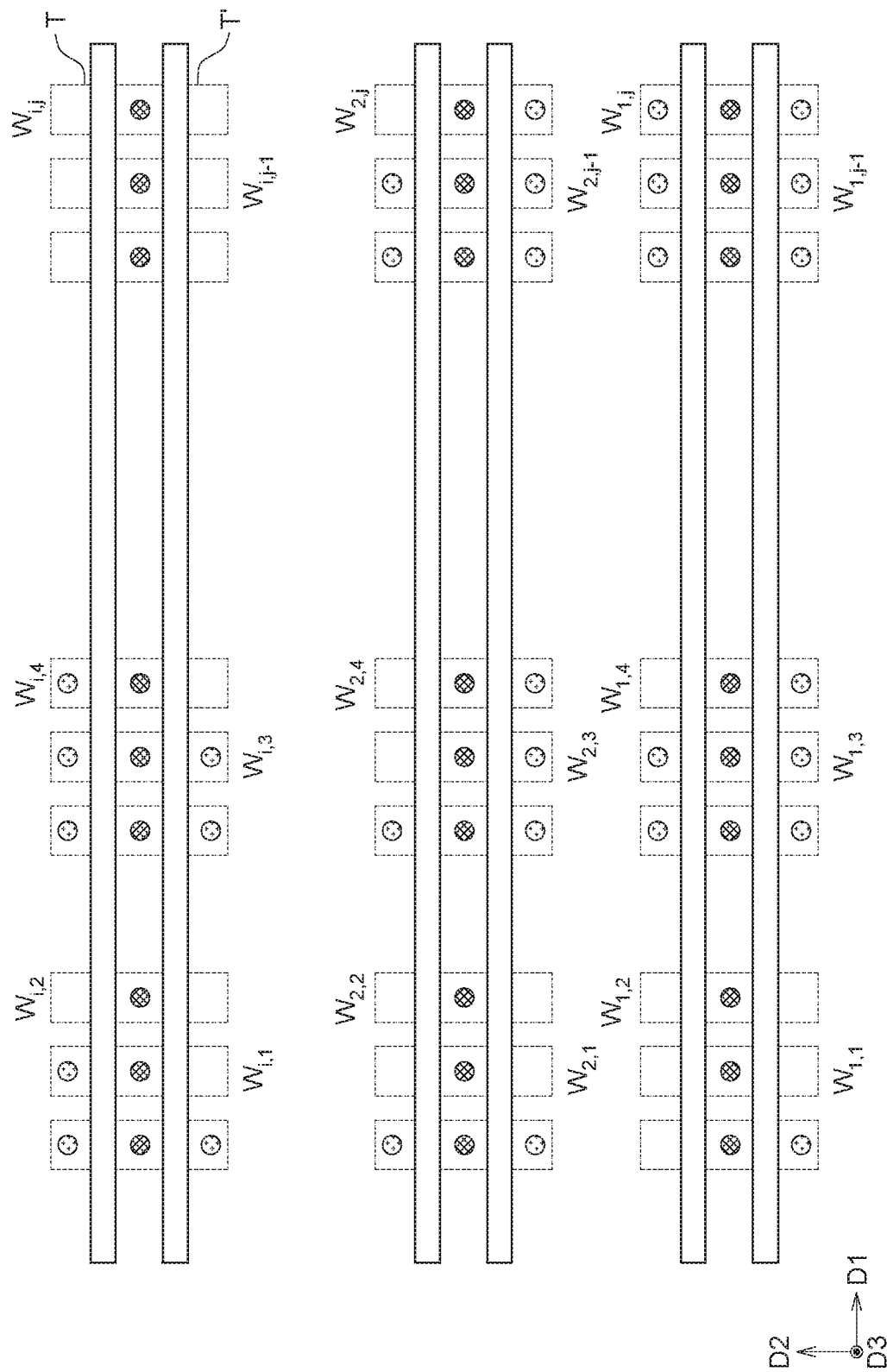

FIG. 13 and FIG. 14 are referred, which are respectively different from FIG. 7 and FIG. 8 with the following illustrations. In this embodiment, 54 transistors (i.e. the transistors T and the transistors T') as shown in FIG. 14 define out 18 synapse weights W. Each of the synapse weights W have 3 transistors, i.e. 3 transistors T, or 3 transistors T'. In an embodiment, weight values of the synapse weights as shown in FIG. 14 relate to the amount of active transistor and may comply with $W_{1,1}: W_{1,2}: W_{1,3}: W_{1,4}: W_{1,j-1}: W_{1,j}: W_{2,1}: W_{2,2}: W_{2,3}: W_{2,4}: W_{2,j-1}: W_{2,j}: W_{i,1}: W_{i,2}: W_{i,3}: W_{i,4}: W_{i,j-1}: W_{i,j}=1:0:3:2:3:3:1:1:3:1:3:2:1:2:2:3:0:0$. However, the present disclosure is not limited thereto. In other embodiments, the weight values of the synapse weights may have other relations resulted from the amount of the active transistor, and/or a structure arrangement of the transistor T such as a dopant condition of the active region. Different amounts of synapse weight W defined with the transistors of the same amount defining out in the second embodiment and the third embodiment is resulted from different arrangements for the second conductive layers M2, the third conductive elements C3 and the third conductive layers M3. The synapse weights W adjacent to each other may share the same first conductive element C1S. For example, the synapse weight $W_{1,1}$ and the synapse weight $W_{1,2}$ may share the same first conductive element C1S.

Figure 15:
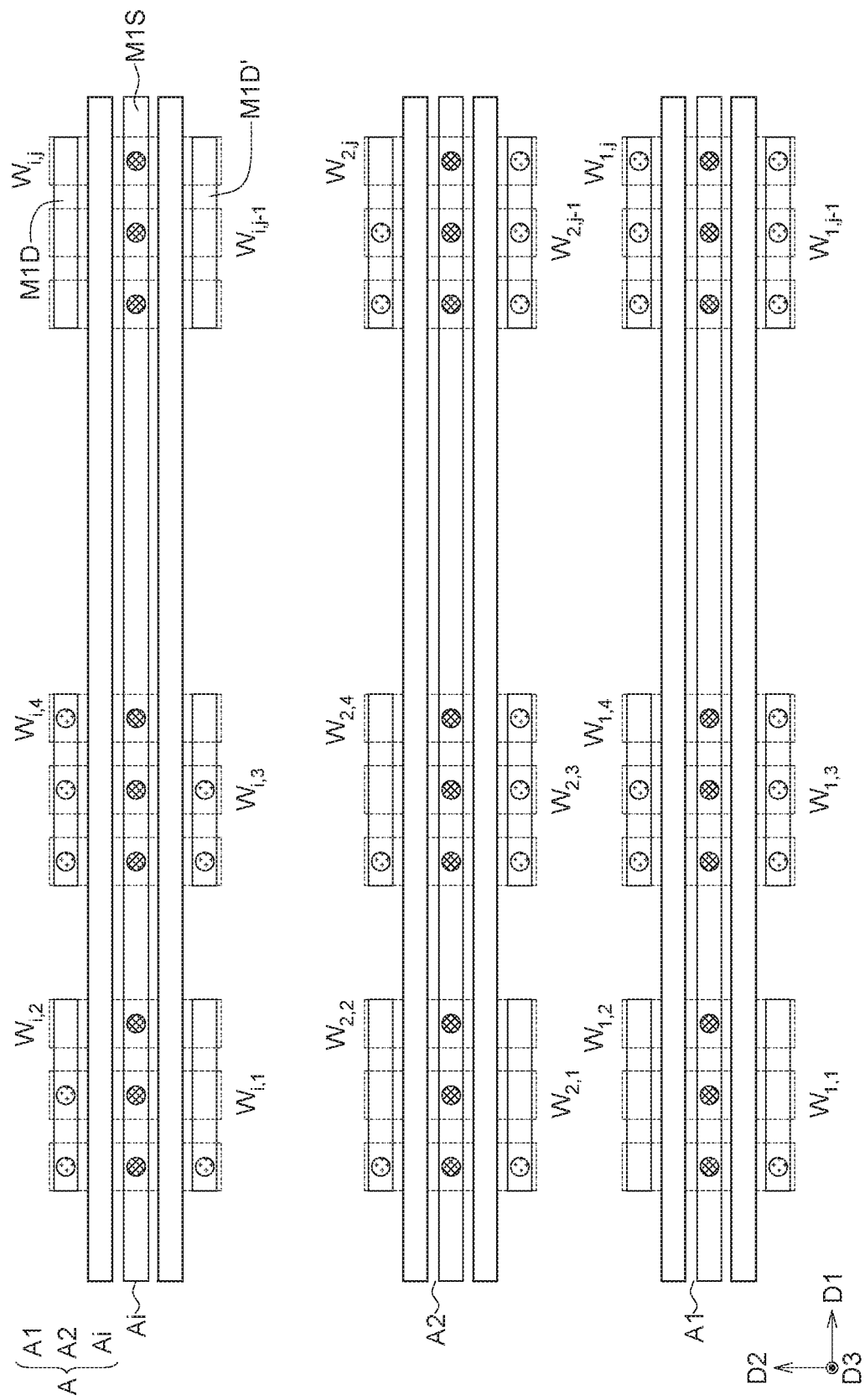

Referring to FIG. 13 and FIG. 15, the first conductive layers M1S, the first conductive layers M1D and the first conductive layers M1D' may be formed.

Figure 16:
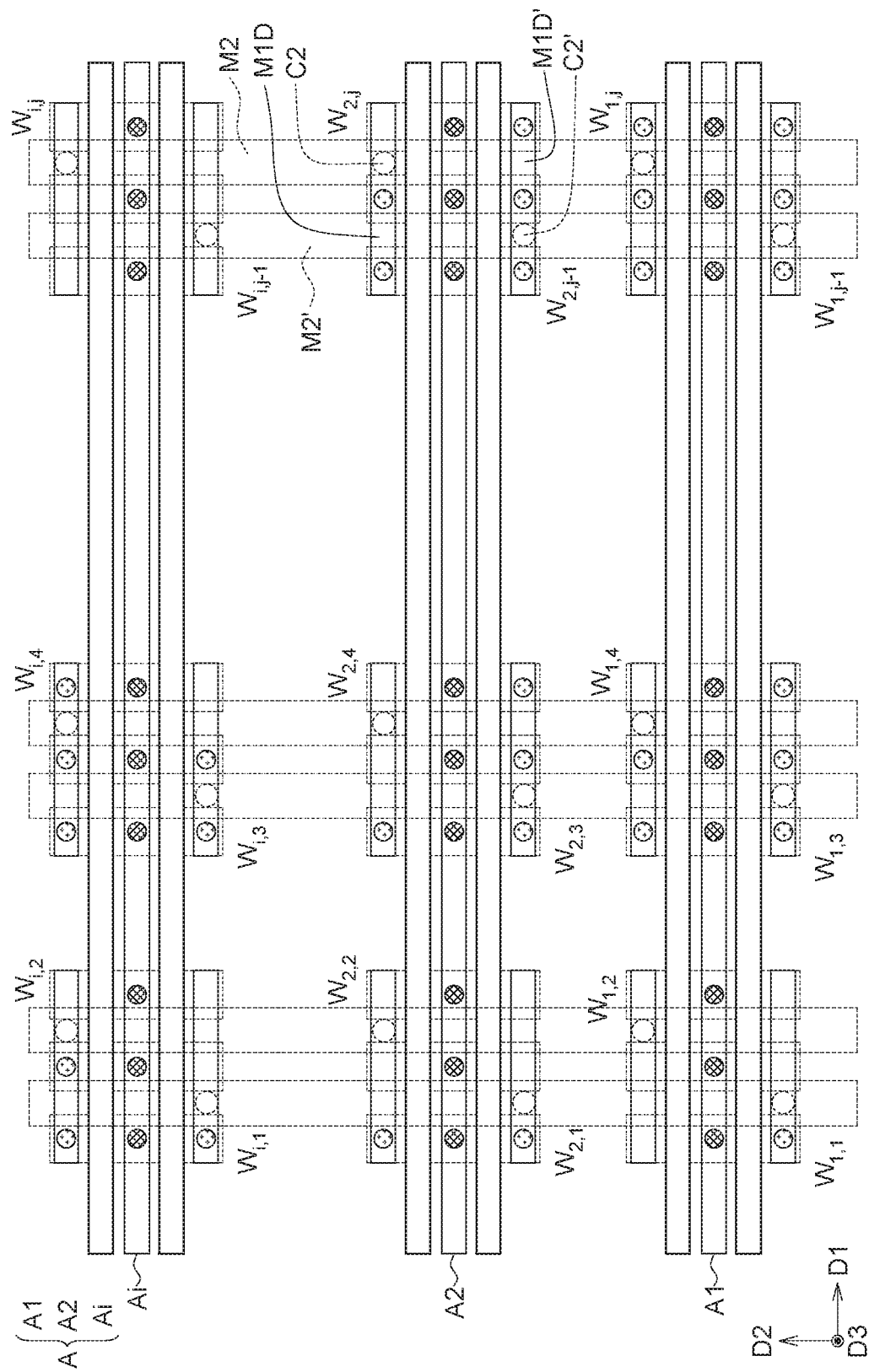

Referring to FIG. 13 and FIG. 16, the second conductive elements C2 are formed on the first conductive layers M1D, and the second conductive elements C2' are formed on the first conductive layers M1D'. The second conductive layers M2 are formed on the second conductive elements C2. The second conductive layers M2' are formed on the second conductive elements C2'. The second conductive layer M2 and the second conductive layer M2' are separated from each other. In an embodiment, the second conductive layer M2 and the second conductive layer M2' may be formed at the same time. In an embodiment, the second conductive layers M2 and the second conductive layers M2' may be a second metal layer.

Figure 17:
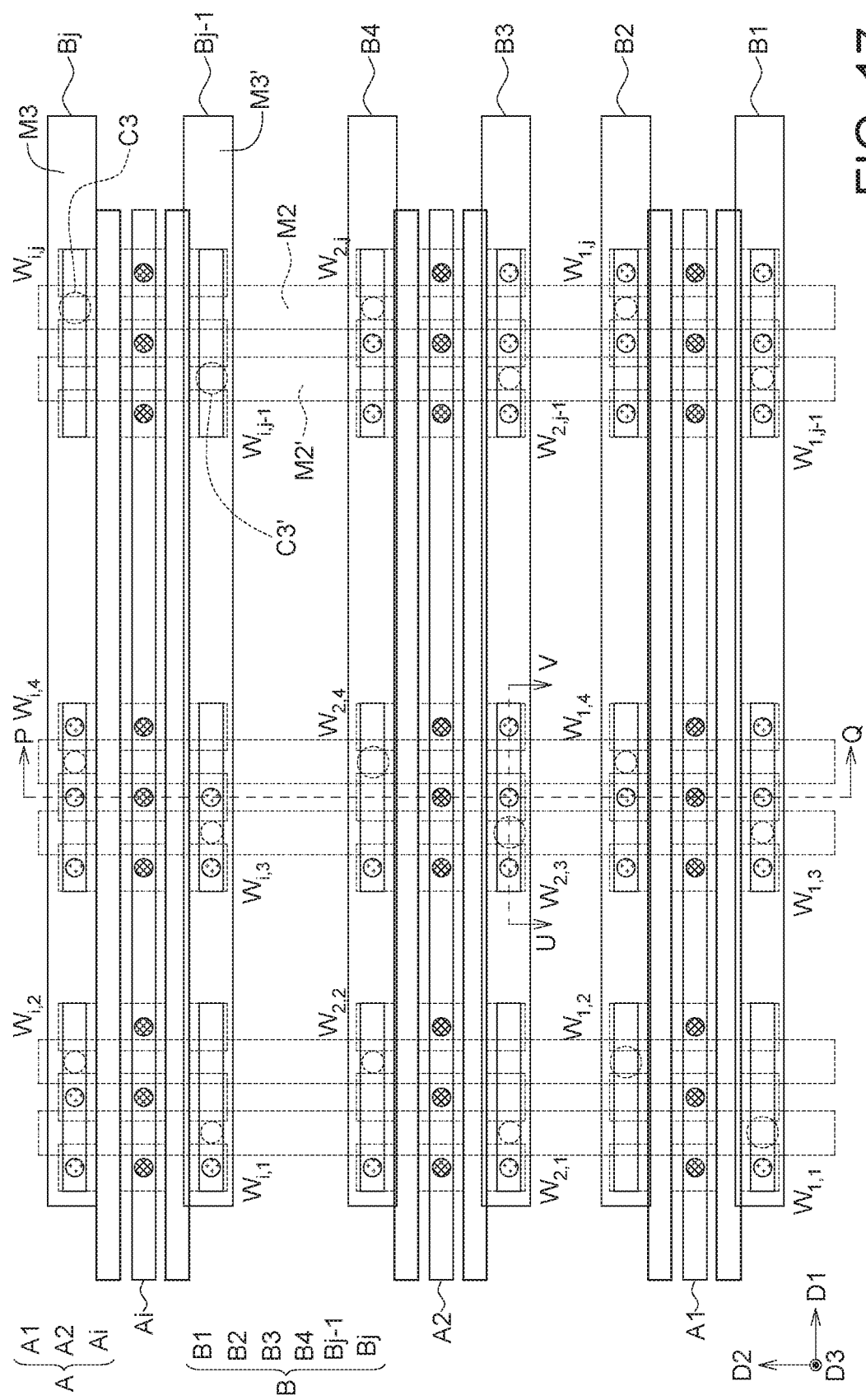

Referring to FIG. 13 and FIG. 17, the third conductive elements C3 are formed on the second conductive layers M2. The third conductive elements C3' are formed on the second conductive layers M2'. The third conductive layers M3 are formed on the third conductive elements C3. The third conductive layers M3' are formed on the third conductive elements C3'. The third conductive element C3 is electrically connected between the second conductive layer M2 and the third conductive layer M3. The third conductive element C3' is electrically connected between the second conductive layer M2' and the third conductive layer M3'. In this embodiment, the second neural circuit B (such as the second neural circuit B2, the second neural circuit B4 or the second neural circuit Bj) may comprise the second conductive layer M2, the third conductive element C3 and the third conductive layer M3. The second neural circuit B (such as the second neural circuit B1, the second neural circuit B3 or the second neural circuit Bj-1) may comprise the second conductive layer M2', the third conductive element C3' and the third conductive layer M3'.

Figure 18:
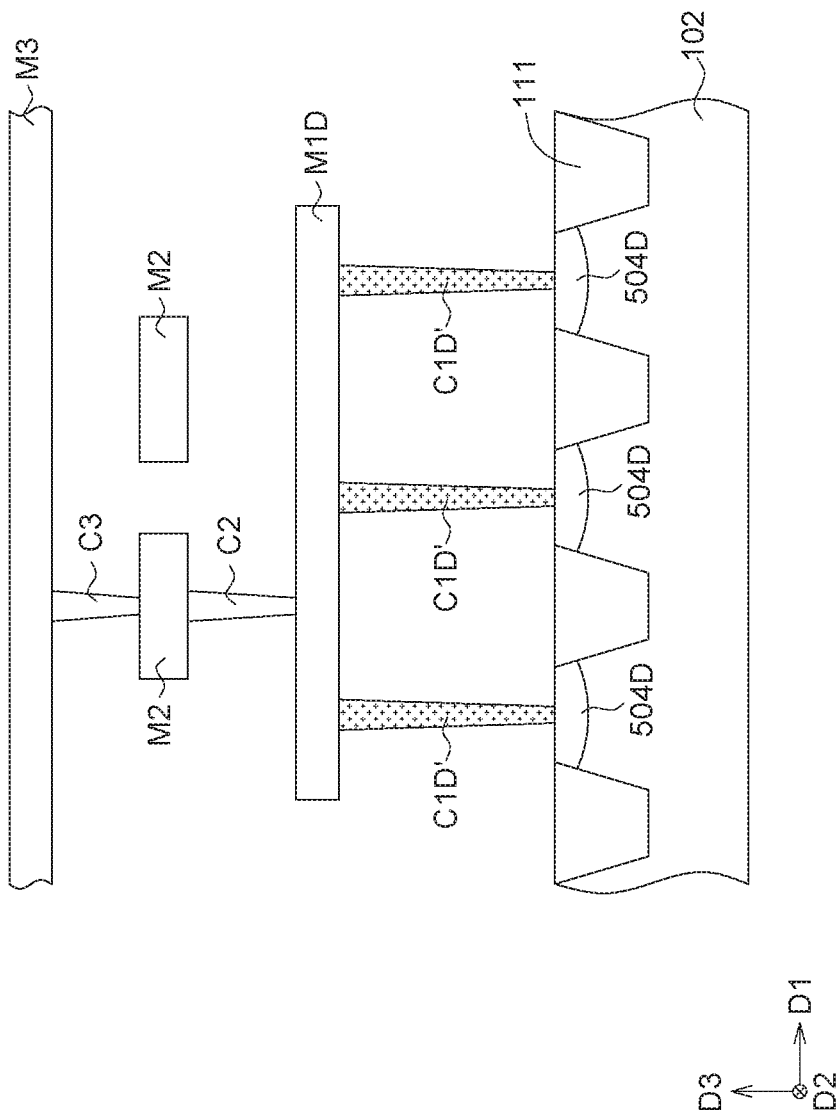

A cross-section view of the neuromorphic computing device along a PQ line in FIG. 17 is shown in FIG. 13. A cross-section view of the neuromorphic computing device along a UV line in FIG. 17 is shown in FIG. 18. The cross-section views of FIG. 13 and FIG. 18 do not show the inter-layer dielectric of the neuromorphic computing device.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A neuromorphic computing device, comprising:
   synapse weights having different weight values which results from different transistor arrangements of the synapse weights.

2. The neuromorphic computing device according to claim 1, wherein each of the synapse weights has at least one active transistor and/or at least one dummy transistor.

3. The neuromorphic computing device according to claim 2, wherein the synapse weights have different amounts of active transistor.

4. The neuromorphic computing device according to claim 2, wherein each of the active transistor and the dummy transistor comprises:
   a substrate;
   a source;
   a drain; and
   a gate on the semiconductor substrate between the source and the drain.

5. The neuromorphic computing device according to claim 1, wherein the synapse weights have the same amount of transistor.

6. The neuromorphic computing device according to claim 1, wherein one of the synapse weights has a dummy transistor.

7. The neuromorphic computing device according to claim 6, wherein the dummy transistor has a source/drain being floating.

8. The neuromorphic computing device according to claim 1, further comprising:
   a first neural circuit; and
   a second neural circuit,
   wherein one of the synapse weights has an active transistor electrically connected between the first neural circuit and the second neural circuit.

9. The neuromorphic computing device according to claim 1, further comprising a first neural circuit electrically connected to sources/drains of transistors of the synapse weights, wherein the transistors electrically connected to the first neural circuit have a common gate.

10. The neuromorphic computing device according to claim 1, further comprising a second neural circuit electrically connected to sources/drains of transistors of the synapse weights, wherein the transistors electrically connected to the second neural circuit have gates separated from each other.

11. The neuromorphic computing device according to claim 1, wherein one synapse weight of the synapse weights comprises at least one transistor and at least one first conductive element electrically connected onto a source/drain of the at least one transistor.

12. The neuromorphic computing device according to claim 11, wherein the at least one first conductive element is functioned as a signal input element of the one synapse weight.

13. The neuromorphic computing device according to claim 12, further comprising a first neural circuit, wherein the first neural circuit comprises a first conductive layer disposed on the at least one first conductive element, the at least one first conductive element is electrically connected between the first conductive layer and the source/drain.

14. The neuromorphic computing device according to claim 11, wherein the at least one first conductive element is used as a signal output element of the one synapse weights.

15. The neuromorphic computing device according to claim 14, further comprising:
a first conductive layer disposed on the at least one first conductive element;
a second conductive element disposed on the first conductive layer;
a second conductive layer disposed on the second conductive element;
a third conductive element disposed on the second conductive layer; and
a third conductive layer disposed on the third conductive element;
wherein the at least one first conductive element, the first conductive layer, the second conductive element, the second conductive layer and the third conductive element are electrically connected between the third conductive layer and the source/drain.

16. The neuromorphic computing device according to claim 15, comprising a second neural circuit, wherein the second neural circuit comprises the second conductive layer, the third conductive element and the third conductive layer.

17. The neuromorphic computing device according to claim 11, wherein each of the transistors comprises an another source/drain, wherein the source/drain is one of a source and a drain, the another source/drain is the other of the source and the drain, the synapse weights have a signal output element electrically connected to the another source/drain of at least one of the transistors.

18. The neuromorphic computing device according to claim 1, wherein the synapse weights have transistors having a common gate, or having a common source/drain.

19. The neuromorphic computing device according to claim 1, wherein one of the synapse weights has transistors having a common gate, or having a common source/drain.

20. The neuromorphic computing device according to claim 1, wherein the synapse weights have transistors having different doping arrangements.

21. The neuromorphic computing device according to claim 1, wherein the weight values are defined by using a photomask directly.

* * * * *